Aug. 29, 1961 W. L. LEHNER 2,998,130

ELECTRICAL DEVICE

Filed May 8, 1959

INVENTOR
William L. Lehner
BY
Robert E. Strauser
ATTORNEY

United States Patent Office 2,998,130

Patented Aug. 29, 1961

2,998,130
ELECTRICAL DEVICE

William L. Lehner, Snyder, N.Y., assignor to Sylvania Electric Products Inc., a corporation of Delaware Filed May 8, 1959, Ser. No. 812,023
4 Claims. (Cl. 206—46)

This invention relates to the packaging and assembly of electrical devices of the type employing flexible leads.

Many electrical devices such as transistors utilize external leads which are easily deformed. These devices are normally shipped to the user in boxes and, upon removal, must have the leads straightened prior to assembly upon the electrical chassis with which they are utilized. The lead straightening and transistor assembly operations are generally performed manually in a number of slow and tedious steps.

Accordingly, an object of this invention is to package electrical devices using flexible leads in such a manner that no manual lead straightening operation is required by the user.

A further object is to align the leads of electrical devices during manufacture thereof and to maintain them in an aligned position during shipment and ultimate assembly upon the electrical chassis.

A still further object is to protect the leads of an electrical device during shipment and to provide guide means for the leads during their insertion into the apertures of a printed circuit board chassis during assembly.

The foregoing objects are achieved in one aspect of the invention by the provision of a molded compressible heat and electrical insulating spacer formed about the leads of the electrical device. During assembly of the device upon the electrical chassis, the spacer is compressed to allow emergence of the ends of the leads from the spacer body, thereby enabling an electrical connection to be made between the device and chassis.

For a better understanding of the invention, reference is made to the following description taken in conjunction with the accompanying drawings in which.

Figure 1:
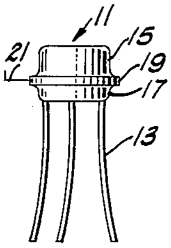
FIG. 1 is a plan view of an electrical device such as a transistor.

Referring to the drawings, an electrical device such as transistor 11 is shown with flexible leads 13 extending longitudinally from an envelope comprising metal or ceramic cap 15 and base 17. The envelope components 15 and 17 may be interlocked or welded to one another at rim 19. An index lug 21 can be connected to the rim, as shown, or to either the cap or base, if desired.

After device 11 has been made, it is packaged with leads 13, which have been straightened, formed within a compressible heat and electrical insulating plastic spacer 23. This spacer insures protection and alignment of the leads during handling and assembly upon printed circuit board chassis 25.

Figure 2:
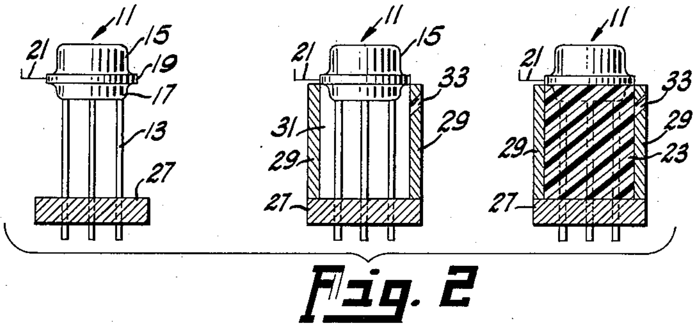
FIG. 2 illustrates several steps in the process of packaging the transistor.

Referring to FIG. 2, leads 13 are first clamped in plate 27 and drawn tight to straighten and align the leads relative to one another and to index lug 21. Side wall forms 29 are then moved to a position where they contact rim 19 and plate 27, thereby forming a mold cavity 31. The plastic spacer 23 is subsequently molded in cavity 31.

Although many types of plastic materials which are compressible and have at least moderately high heat and electrical insulation characteristics may be used, it has been found that a styrene product marketed by Koppers Company Inc. under the name of Dylite F–40 is suitable for this purpose. Dylite is available in pellet form and can be dispensed into cavity 31 through aperture 33. This material foams to produce spacer 23 in the presence of moisture and moderate heat. The foaming action may be inaugurated by injecting into the mold a small amount of water or steam. If water is used, it is usually necessary to heat the mold to a moderate temperature to induce foaming. The styrene spacer is cellular to provide good heat and electrical insulating characteristics. It can be considerably compressed or flattened and it has a moderate degree of resiliency.

Figure 3:
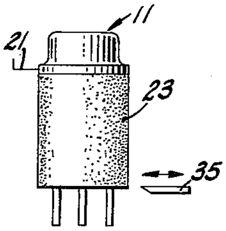
FIG. 3 shows the lead cutting operation after the package has been formed.

After spacer 23 is molded, the side wall forms 29 and clamping plate 27 are removed and the ends of leads 13 extending from the spacer are cut or severed by tool 35, FIG. 3.

Figure 4:
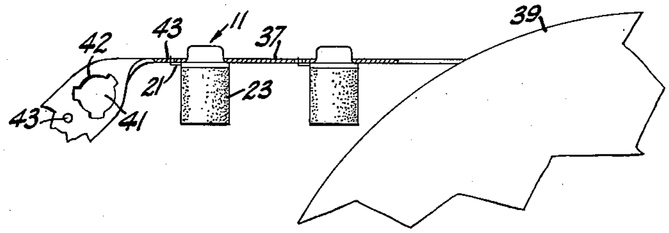
FIG. 4 illustrates a tape carrier and spool structure adapted for stacking the transistors in spaced relationship relative to one another.

A carrier 37 and spool 39, FIG. 4, are employed so that the transistors may be shipped in a fashion which enables the user to automatically assemble the transistor on the electrical chassis. The transistors are mounted on the carrier and rolled upon spool 39 for shipment to the user. Carrier 37 is provided with openings 41 having, for instance, several spaced ears 42 extending into the opening for contacting and supporting cap 15. During assembly of device 11 on carrier 37, the cap is press-fitted into openings 41 and aligned so that the index lug 21 slides into index aperture 43. The lead alignment for all of the transistors is thereby standardized relative to the tape or carrier.

Figure 7:
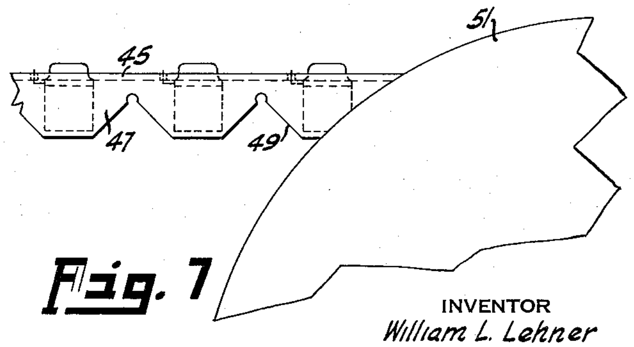
FIG. 7 shows another embodiment of a transistor tape carrier adapted to be used in the same manner as the carrier shown in FIG. 4.

Carrier 37 may be made of cardboard or a similar stiff material. If desired, instead of the flat strip form shown in FIG. 4, the carrier may take the form shown in FIG. 7. In this embodiment, the carrier has an apertured top strip 45 formed with apertures like tape 37 and side panels 47 disposed on either side of device 11. Cut-out portions 49 are provided in the side walls to facilitate winding upon spool 51. An adhesive tape carrier may also be employed, if desired.

Figure 5:
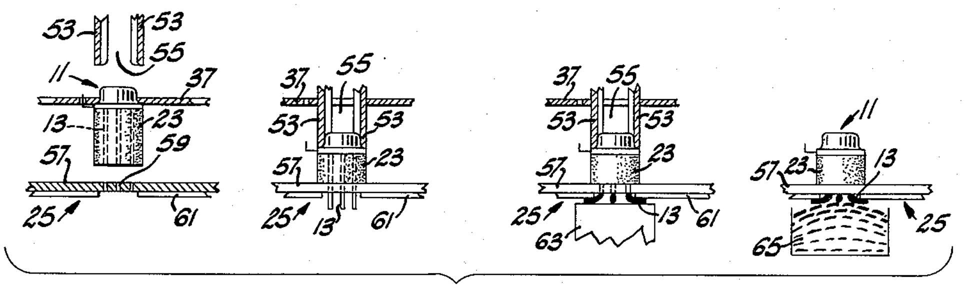
FIG. 5 illustrates several steps utilized in the process of removing the transistor from the carrier, and mounting it upon the electrical chassis.
Figure 6:
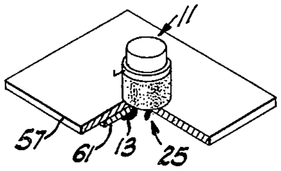
FIG. 6 is a perspective view of a packaged transistor mounted upon the electrical chassis.

When transistor 11 is to be mounted upon printed circuit board 25, the transistor is positioned intermediate the insertion head 53 and the panel 25, FIG. 5. Head 53 has a recess 55 substantially conforming to the shape of cap 15. Several segments are formed in head 53 to pass between the ears 42 in carrier 37 and grasp cap 15. The printed circuit board 25 comprises an insulating member 57 having apertures 59 formed therein which are spaced from one another in the same manner as leads 13. Mounted on board 57 adjacent the apertures 59 are conductors 61.

During assembly, transistor 11 is fed beneath head 53 on carrier 37 to the correct position. Leads 13 are aligned relative to the head and to the panel apertures by virtue of the cooperation of index lug 21 with index aperture 43. The head is moved down to contact and grasp cap 15 and strip the transistor from carrier 57. Further downward motion causes spacer 23 to contact the top surface of board 25. During the final downward movement of the head, spacer 23 is compressed, thereby allowing emergence of the leads from the spacer body and passage of the leads through aperture 59. Immediately after insertion of the leads through the board apertures, a clinching device 63 bends the leads into contact with conductors 61. Insertion head 53 and clinching device 63 are then retracted and board 25 is eventually moved to a position where solder connections between leads 13 and conductors 61 are made. This soldering operation may be performed with a solder pot 65. Spacer 23 serves to heat insulate device 11 from pot 65 during the solder operation.

Due to the slight resiliency of the styrene spacer 23, there is a tendency for the spacer to press upwardly on device 11 and draw the clinched leads 13 tightly against conductors 61 after head 53 and clinching device 63 have been removed. This insures an excellent electrical contact for the soldering operation.

The utilization of a spacer of the type described herein insures that the electrical device leads are straight and in alignment during shipment and assembly upon the electrical chassis. The spacer allows the use of tape packaging, which facilitates automatic feed to the assembly position. In addition, the spacer serves to guide the leads into the chassis apertures during insertion and to expand and draw the clinched leads tightly against the chassis conductors to insure excellent electrical contact.

During the soldering operation and also during ultimate use of the transistor, a considerable amount of heat is generated in the leads 13 and in the vicinity of the chassis. The cellular spacer 23 serves to insulate the transistor so that its characteristics are not affected by the heat. The electrical insulating characteristics of the spacer isolate the transistor from the chassis and the leads from one another.

Although several embodiments of the invention have been shown and described, it will be apparent to those skilled in the art that various changes and modifications may be made therein without departing from the scope of the invention as defined by the appended claims.

Having thus described my invention, I claim:

1. A package for an electrical device having flexible longitudinally arrayed external substantially straight leads comprising an envelope for said device, and a compressible heat and electrical insulating spacer and lead protector formed about said leads terminating longitudinally at the ends thereof.

2. A package for an electrical device having flexible longitudinally arrayed external substantially straight leads comprising an envelope for said device formed to provide a lateral rim, and a compressible heat and electrical insulating spacer and lead protector formed about said leads and at least a portion of said envelope terminating laterally approximately at said rim and terminating longitudinally at the ends of said leads.

3. A package for an electrical device adapted to be mounted upon a carrier having flexible longitudinally arrayed external substantially straight leads comprising an envelope for said device formed to provide a lateral rim, an index lug attached to said envelope for orienting the device on said carrier, and a compressible heat and electrical insulating spacer and lead protector formed about said leads and at least a portion of said envelope terminating laterally approximately at said rim and terminating longitudinally at the ends of said leads.

4. A package for an electrical device having flexible longitudinally arrayed external substantially straight leads comprising an envelope for said device, and a compressible heat and electrical insulating plastic spacer and lead protector molded about said leads and at least a portion of said envelope terminating longitudinally at the ends of said leads.

References Cited in the file of this patent

UNITED STATES PATENTS

| | | |
|---|---|---|
| 1,910,041 | Noquchi | May 23, 1933 |
| 2,544,654 | Brown | Mar. 13, 1951 |
| 2,545,762 | Brown | Mar. 20, 1951 |
| 2,815,124 | Pellier | Dec. 3, 1957 |
| 2,861,250 | Elwell | Nov. 18, 1958 |
| 2,887,729 | Imhof | May 26, 1959 |